(12) United States Patent
Kim (10) Patent No.: US 11,418,008 B2
(45) Date of Patent: Aug. 16, 2022

(54) LASER DEVICE

(71) Applicant: ELECTRONICS AND TELECOMMUNICATIONS RESEARCH INSTITUTE, Daejeon (KR)

(72) Inventor: Jin Tae Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 180 days.

(21) Appl. No.: 16/824,317

(22) Filed: Mar. 19, 2020

(65) Prior Publication Data

US 2020/0303890 A1 Sep. 24, 2020

(30) Foreign Application Priority Data

Mar. 20, 2019 (KR) .................... 10-2019-0032026
Feb. 3, 2020 (KR) .................... 10-2020-0012474

(51) Int. Cl.
*H01S 5/11* (2021.01)
*H01S 5/10* (2021.01)
*H01S 5/04* (2006.01)
*H01S 5/026* (2006.01)
*H01S 5/02* (2006.01)
(Continued)

(52) U.S. Cl.
CPC ............ *H01S 5/11* (2021.01); *H01S 5/026* (2013.01); *H01S 5/0218* (2013.01); *H01S 5/041* (2013.01); *H01S 5/1042* (2013.01); *H01S 5/021* (2013.01); *H01S 5/02326* (2021.01);
(Continued)

(58) Field of Classification Search
CPC ...... H01S 5/041; H01S 3/0915; H01S 3/0933; H01S 3/0941; H01S 3/0635; H01S 5/11; H01S 5/1206–1218; H01S 5/026–0268; H01S 5/02325–02326; H01S 5/1042
See application file for complete search history.

(56) References Cited

U.S. PATENT DOCUMENTS 4,037,263 A * 7/1977 Moeckel .............. G02F 1/095
360/114.08
5,332,681 A * 7/1994 Tonucci ............ H01L 29/66469
438/944
(Continued)

FOREIGN PATENT DOCUMENTS

CN 108199260 A * 6/2018 ............ H01S 5/041
CN 110994355 A * 4/2020 ............ H01S 5/026
(Continued)

OTHER PUBLICATIONS

Alexander Fang et al., "Electrically pumped hybrid AlGaInAs-silicon evanescent laser", Optics Express, Oct. 2, 2006, pp. 9203-9210, vol. 14, No. 20.
(Continued)

*Primary Examiner* — Joshua King (57) ABSTRACT

Disclosed is a laser device. The laser device includes a substrate, a pump light source which is disposed on the substrate and provided with a light emitting layer configured to generate pump light, and an upper waveguide which is disposed above the pump light source in a first direction and provided with an upper resonator configured to allow laser light to be generated and resonate by using the pump light.

14 Claims, 9 Drawing Sheets

(51) Int. Cl.
  *H01S 5/02326* (2021.01)
  *H01S 5/34* (2006.01)
  *H01S 5/12* (2021.01)

(52) U.S. Cl.
  CPC ........... *H01S 5/1014* (2013.01); *H01S 5/1032* (2013.01); *H01S 5/1206* (2013.01); *H01S 5/3412* (2013.01)

(56) References Cited

U.S. PATENT DOCUMENTS

| | | | | |
|---|---|---|---|---|
| 5,682,401 | A * | 10/1997 | Joannopoulos | G02B 6/1225 372/99 |
| 5,955,749 | A * | 9/1999 | Joannopoulos | G02B 6/1225 257/E33.068 |
| 6,330,265 | B1 * | 12/2001 | Kinoshita | G02B 6/12007 372/50.12 |
| 6,416,575 | B2 * | 7/2002 | Yamada | G02B 6/42 117/1 |
| 6,711,200 | B1 * | 3/2004 | Scherer | B82Y 20/00 372/39 |
| 6,768,593 | B1 | 7/2004 | Jutamulia | |
| 7,248,615 | B2 * | 7/2007 | Assefa | H01S 5/10 372/92 |
| 7,298,949 | B2 * | 11/2007 | Gothoskar | G02F 1/025 385/2 |
| 7,351,601 | B2 * | 4/2008 | Scherer | G02B 6/1225 438/31 |
| 7,693,361 | B2 | 4/2010 | Leem et al. | |
| 7,826,511 | B1 * | 11/2010 | Yap | H01S 5/028 372/75 |
| 8,362,603 | B2 * | 1/2013 | Lim | H01L 33/486 257/688 |
| 8,798,414 | B2 * | 8/2014 | Quan | B82Y 20/00 385/10 |
| 9,031,363 | B2 | 5/2015 | Tseng | |
| 9,239,424 | B2 * | 1/2016 | Czornomaz | H01L 33/005 |
| 9,291,836 | B2 | 3/2016 | Kim et al. | |
| 9,599,770 | B2 | 3/2017 | Englund et al. | |
| 10,892,388 | B2 * | 1/2021 | Hendrickson | H01L 33/20 |
| 2001/0019565 | A1 * | 9/2001 | Iwasaki | H01S 3/0959 372/39 |
| 2001/0026857 | A1 * | 10/2001 | Kinoshita | H01S 5/423 372/66 |
| 2002/0167984 | A1 * | 11/2002 | Scherer | G02B 6/13 372/50.1 |
| 2002/0171919 | A1 * | 11/2002 | Blauvelt | H01S 5/026 359/344 |
| 2003/0026312 | A1 * | 2/2003 | Clayton | H01S 5/041 372/50.1 |
| 2004/0218651 | A1 * | 11/2004 | Iwasaki | H01S 3/0959 372/69 |
| 2005/0111511 | A1 * | 5/2005 | Assefa | H01S 5/10 372/92 |
| 2006/0050744 | A1 * | 3/2006 | Wong | H01S 3/302 372/3 |
| 2006/0227830 | A1 * | 10/2006 | Keady | F03H 1/0081 372/39 |
| 2007/0153868 | A1 * | 7/2007 | West | H01S 5/0424 372/92 |
| 2007/0171953 | A1 * | 7/2007 | Shur | H01S 3/0933 372/71 |
| 2008/0031297 | A1 * | 2/2008 | Uchida | G02B 6/1225 438/22 |
| 2008/0285610 | A1 * | 11/2008 | Hall | C03C 13/048 359/337.3 |
| 2009/0116523 | A1 * | 5/2009 | Leem | H01S 5/026 372/44.01 |
| 2010/0054291 | A1 * | 3/2010 | Yukawa | H01S 3/168 372/39 |
| 2010/0054294 | A1 * | 3/2010 | Yukawa | H01S 3/168 372/53 |
| 2010/0187554 | A1 * | 7/2010 | Jang | H01L 33/20 257/E33.064 |
| 2011/0026888 | A1 * | 2/2011 | Nekado | G02B 6/4284 385/92 |
| 2012/0072931 | A1 * | 3/2012 | Imada | G11B 5/314 |
| 2012/0099817 | A1 * | 4/2012 | Quan | G02B 6/1225 385/33 |
| 2012/0106583 | A1 * | 5/2012 | Watson | H01S 5/22 438/32 |
| 2014/0098833 | A1 * | 4/2014 | Kim | H01S 5/1838 372/44.011 |
| 2014/0231758 | A1 * | 8/2014 | Mok | H01L 51/5296 257/40 |
| 2014/0247853 | A1 * | 9/2014 | Deppe | H01S 5/18305 372/50.11 |
| 2014/0369700 | A1 * | 12/2014 | Debregeas-Sillard | H01S 5/0622 438/31 |
| 2015/0030282 | A1 * | 1/2015 | Park | G02B 6/1228 438/31 |
| 2015/0372455 | A1 * | 12/2015 | Nam | H01S 5/3223 438/22 |
| 2016/0064894 | A1 * | 3/2016 | Takiguchi | G02F 1/133615 372/26 |
| 2016/0226592 | A1 * | 8/2016 | Arvelo | G02B 6/425 |
| 2016/0252692 | A1 * | 9/2016 | Hofrichter | H01S 5/343 250/227.11 |
| 2017/0018902 | A1 * | 1/2017 | Kim | H01S 3/1685 |
| 2017/0123172 | A1 * | 5/2017 | Adachi | G02B 6/4231 |
| 2017/0294762 | A1 * | 10/2017 | Kim | H01S 5/04257 |
| 2018/0019139 | A1 * | 1/2018 | Sun | G03F 7/162 |
| 2018/0175585 | A1 * | 6/2018 | Crosnier | H01S 5/11 |
| 2018/0358779 | A1 * | 12/2018 | Hwang | H01S 5/0608 |
| 2019/0013648 | A1 * | 1/2019 | Heo | H01L 33/00 |
| 2020/0091682 | A1 * | 3/2020 | Giuntoni | H01S 5/041 |
| 2020/0119519 | A1 * | 4/2020 | Brandt | H01S 5/187 |

FOREIGN PATENT DOCUMENTS

| | | | | |
|---|---|---|---|---|
| DE | 10258475 | A1 * | 7/2004 | ........ H01S 3/0941 |
| DE | 102016014938 | A1 * | 6/2018 | ........ H01S 5/04253 |
| DE | 102016014939 | A1 * | 6/2018 | ........ H01S 5/0208 |
| EP | 1035623 | A1 * | 9/2000 | ........ B82Y 20/00 |
| FR | 3046853 | A1 * | 7/2017 | ........ G02B 6/12002 |
| FR | 3070209 | A1 * | 2/2019 | |
| JP | 10321941 | A * | 12/1998 | ........ H01L 51/5262 |
| JP | 2009238902 | A * | 10/2009 | ........ B82Y 20/00 |
| JP | 2010283335 | A * | 12/2010 | ........ H01S 5/2027 |
| JP | 2017500735 | A * | 1/2017 | |
| KR | 20110092676 | A * | 8/2011 | |
| WO | WO-0128052 | A2 * | 4/2001 | ........ G02B 6/42 |
| WO | WO-2015080666 | A1 * | 6/2015 | ........ B82Y 20/00 |
| WO | WO-2016207495 | A1 * | 12/2016 | ........ B82Y 20/00 |

OTHER PUBLICATIONS

Jason Ross et al., "Electrically tunable excitonic light-emitting diodes based on monolayer WSe2 p-n junctions", Nature Nanotechnology, Mar. 9, 2014, pp. 1-5.

Jungmin Lee et al., "Printed Nanolaser on Silicon", ACS Photonics, 2017, pp. 2117-2123, vol. 4.

Junyong Wang et al., "Electroluminescent Devices Based on 2D Semiconducting Transition Metal Dichalcogenides", Advanced Materials, 2018, pp. 1802687-1-1802687-14.

Rui Cheng et al., "Electroluminescence and Photocurrent Generation from Atomically Sharp WSe2/MoS2 Heterojunction p-n Diodes", Nano Letters, 2014, pp. 5590-5597, vol. 14.

Yusuke Miyoshi et al., "High-speed and on-chip graphene blackbody emitters for optical communications by remote heat transfer", Nature Communications, pp. 1-9, 2018.

* cited by examiner

LASER DEVICE

CROSS-REFERENCE TO RELATED APPLICATIONS

This U.S. non-provisional patent application claims priority under 35 U.S.C. § 119 of Korean Patent Application No. 10-2019-0032026, filed on Mar. 20, 2019, and 10-2020-0012474, filed on Feb. 3, 2020 the entire contents of which are hereby incorporated by reference.

BACKGROUND

The present disclosure herein relates to a laser device, and more particularly, to a laser device which uses pump light to generate laser light.

Optical communication technologies have been rapidly developed on the basis of laser light. The laser light may have a visible light wavelength and an infrared light wavelength. Among them, the laser light having the infrared light wavelength may be mainly used in the optical communication. Laser devices may include a vertical-cavity surface emitting laser (VCSEL), an optical fiber-coupled laser diode, and a semiconductor laser diode.

SUMMARY

The present disclosure provides a laser device capable of increasing a degree of integration of a plurality of light sources.

An embodiment of the inventive concept provides a laser device including: a substrate; a pump light source which is disposed on the substrate and has a light emitting layer configured to generate pump light; and an upper waveguide which is disposed above the light emitting layer in a first direction and has an upper resonator configured to allow laser light to be generated and resonate by using the pump light.

In an embodiment, the light emitting layer may include graphene or metal chalcogenide.

In an embodiment, the pump light source may further include upper electrodes which are disposed on both side walls of the light emitting layer outside the upper waveguide.

In an embodiment, the pump light source may further include a lower electrode between the light emitting layer and the substrate.

In an embodiment, the laser device may further include first lower waveguides which are disposed between the substrate and the upper waveguide outside the light emitting layer and extend in the first direction.

In an embodiment, the laser device may further include a second lower waveguide which includes a lower resonator disposed between the light emitting layer and the substrate and extends in the first direction.

In an embodiment, the lower resonator may include: a lower resonance hole; a first lower mirror hole disposed on one side of the lower resonance hole; and a second lower mirror hole disposed on the other side of the lower resonance hole.

In an embodiment, the upper resonator may include: an upper resonance hole which is disposed above the lower resonance hole and larger than the lower resonance hole; a first upper mirror hole disposed on one side of the upper resonance hole; and a second upper mirror hole disposed on the other side of the upper resonance hole.

In an embodiment, the laser device may further include a first alignment key which is provided within the first upper mirror hole and the first lower mirror hole.

In an embodiment, the upper waveguide may further include an upper alignment hole which is spaced apart from the upper resonator, and the second lower waveguide may further include a lower alignment hole which is spaced apart from the lower resonator, wherein the laser device further includes a second alignment key which is provided within the upper alignment hole and the lower alignment hole.

In an embodiment of the inventive concept, a laser device includes: a lower waveguide including a lower resonator on a substrate; a pump light source which is disposed on the lower resonator and has a light emitting layer configured to generate pump light; and an upper waveguide which is disposed above the light emitting layer and the lower waveguide and has an upper resonator configured to allow laser light to be generated and resonate by using the pump light.

In an embodiment, the lower resonator may include: a lower resonance hole; a first lower mirror hole which is disposed on one side of the lower resonance hole and larger than the lower resonance hole; and a second lower mirror hole which is disposed on the other side of the lower resonance hole and has the same size as the first lower mirror hole.

In an embodiment, the upper resonator may include: an upper resonance hole which is disposed above the lower resonance hole and larger than the lower resonance hole; a first upper mirror hole which is disposed on one side of the upper resonance hole and larger than the upper resonance hole; and a second upper mirror hole which is disposed on the other side of the upper resonance hole and has the same size as the first upper mirror hole.

In an embodiment, the laser device may further include a first alignment key which is provided within the first lower mirror hole and the first upper mirror hole.

In an embodiment, the upper resonance hole may be larger than the lower resonance hole, and the first and second lower mirror holes may have the same size as the first and second upper mirror holes.

In an embodiment, the laser device may further include a dielectric layer which is disposed between the lower waveguide and the upper waveguide outside the light emitting layer.

In an embodiment, the upper waveguide may further include an upper alignment hole which is spaced a coupling length from the upper resonator, and the lower waveguide may further include a lower alignment hole which is disposed below the upper alignment hole.

In an embodiment, the laser device may further include a second alignment key which passes through the dielectric layer and is provided within the upper alignment hole and the lower alignment hole.

In an embodiment, the dielectric layer may have a refractive index greater than a refractive index of the upper waveguide and less than a refractive index of the lower waveguide.

In an embodiment, the substrate may include a recess which is disposed below the lower resonator.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Preferred embodiments of the inventive concept will be described in detail with reference to the accompanying drawings. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Further, the present disclosure is only defined by scopes of claims. Like reference symbols refer to like elements throughout.

In this specification, the terms are used only for explaining embodiments while not limiting the present disclosure. In this specification, the singular forms include the plural forms as well, unless the context clearly indicates otherwise. It will be understood that the terms 'comprises' and/or 'comprising', when used in this specification, specify the presence of stated components, operations, and/or elements, but do not exclude the presence or addition of one or more other components, operations, and/or elements. Also, since preferred embodiments are provided below, the order of the reference numerals given in the description is not limited thereto.

Additionally, the embodiments described in this specification will be explained with reference to the cross-sectional views and/or plan views as ideal exemplary views of the present disclosure. In the drawing, the thicknesses of films and regions are exaggerated for effective description of the technical contents. Accordingly, shapes of the exemplary views may be modified according to manufacturing techniques and/or allowable errors. Therefore, the embodiments of the inventive concept are not limited to the specific shape illustrated in the exemplary views, but may include other shapes that are created according to manufacturing processes.

Figure 1:
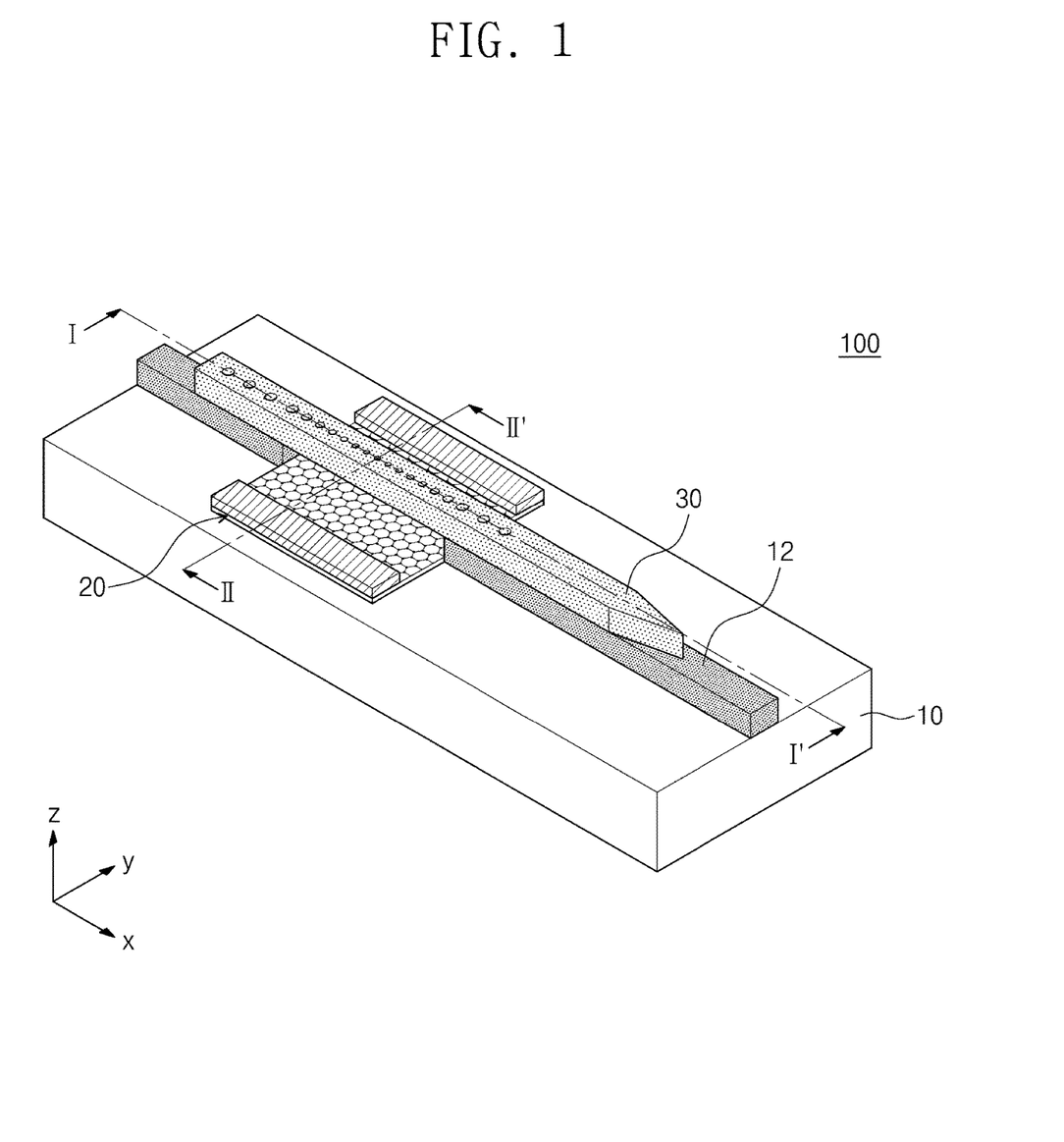
FIG. 1 is a perspective view illustrating one example of a laser device according to an embodiment of the inventive concept.

FIG. 1 illustrates one example of a laser device 100 according to an embodiment of the inventive concept.

Referring to FIG. 1, the laser device 100 according to an embodiment of the inventive concept may be a laser source for optical communication. As one example, the laser device 100 according to an embodiment of the inventive concept may include a substrate 10, a pump light source 20, and an upper waveguide 30.

The substrate 10 may be a silicon oxide substrate or a silicon on insulator (SOI) substrate. Unlike the above, the substrate may be a crystalline silicon substrate or a group III-V semiconductor substrate, but the embodiment of the inventive concept is not limited thereto.

A plurality of first lower waveguides 12 may be provided on the substrate 10. The first lower waveguides 12 may be arranged in a first direction X. The first lower waveguides 12 may be disposed on both sides of the pump light source 20. The first lower waveguides 12 may be a silicon waveguide. Each of the first lower waveguides 12 may have a thickness of about 200 nm to about 350 nm. Each of the first lower waveguides 12 may have a width of about 200 nm to about 1000 nm.

Figure 2:
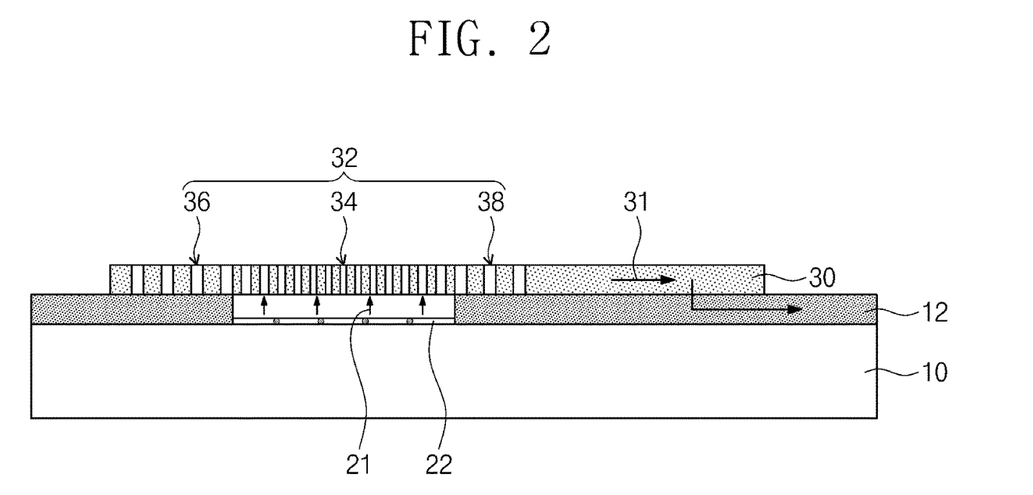
FIGS. 2 and 3 are cross-sectional views, taken along lines I-I' and II-II' of FIG. 1, respectively.
Figure 3:
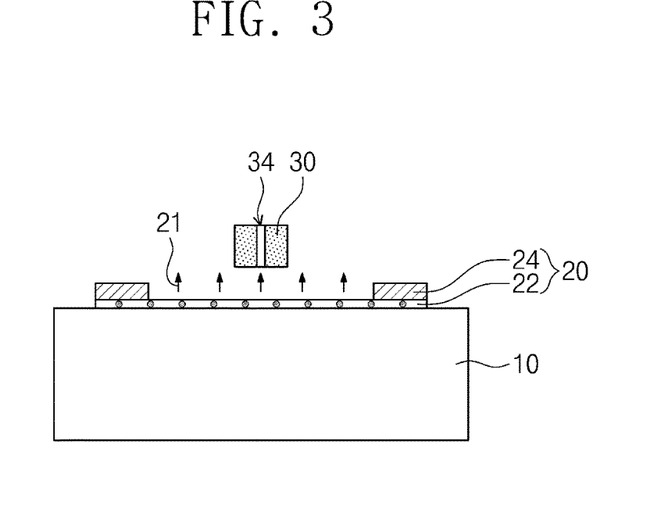

FIGS. 2 and 3 illustrate views taken along lines I-I' and II-II' of FIG. 1, respectively.

Referring to FIGS. 1 to 3, the pump light source 20 may be disposed between the first lower waveguides 12. Also, the pump light source 20 may be disposed between the substrate 10 and the upper waveguide 30. The pump light source 20 may generate pump light 21 and provide the pump light 21 to the upper waveguide 30. The pump light source 20 may be a visible light source. For example, the pump light 21 may have a visible light wavelength of about 400 nm to about 700 nm. Unlike the above, the pump light 21 may have an infrared light wavelength. According to an embodiment of the inventive concept, the pump light source 20 may include a light emitting layer 22 and upper electrodes 24.

The light emitting layer 22 may be disposed between the first lower waveguides 12. The light emitting layer 22 may be disposed between the substrate 10 and the upper waveguide 30. The light emitting layer 22 may be arranged in a second direction Y. According to an embodiment of the inventive concept, the light emitting layer 22 may include a two dimensional material layer. For example, the light emitting layer 22 may include graphene. The light emitting layer 22 may be thinner than each of the first lower waveguides 12. For example, the light emitting layer 22 may have a thickness of about 1 nm to about 10 nm.

The upper electrodes 24 may be respectively disposed on both sides of the light emitting layer 22 outside the upper waveguide 30. When source voltage is applied to each of the upper electrodes 24, the light emitting layer 22 may generate the pump light 21. The pump light 21 may be provided to the upper waveguide 30.

The upper waveguide 30 may be disposed above the first lower waveguides 12 and the light emitting layer 22. The upper waveguide 30 may be arranged in the first direction X. According to an embodiment of the inventive concept, the upper waveguide 30 may include a group III-V semiconductor. For example, the upper waveguide 30 may include InGaAs. The upper waveguide 30 may be a laser light source. The upper waveguide 30 may generate laser light 31 by using the pump light 21. When the pump light 21 is provided to the upper waveguide 30, the upper waveguide 30 may generate the laser light 31, having infrared light corresponding to an energy gap of the group III-V semiconductor, through down-conversion. The laser light 31 may be a continuous wave. When a pulse signal is provided to the upper electrodes 24, the laser light 31 may be output as a pulse light signal according to the pulse signal.

Figure 4:
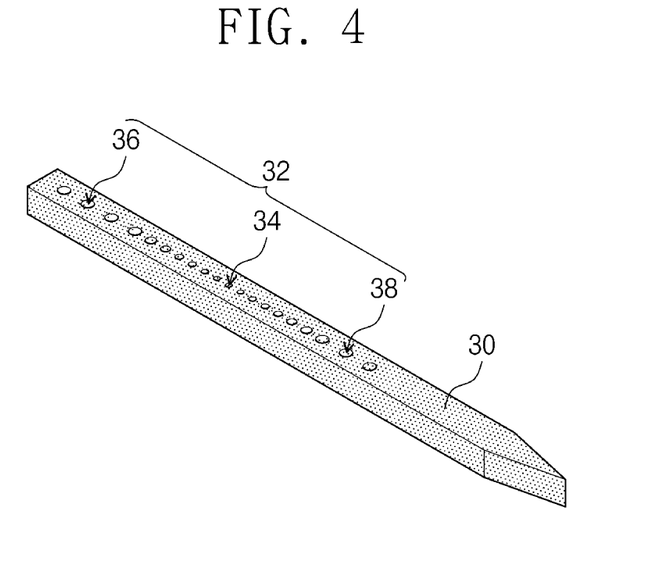
FIG. 4 is a perspective view illustrating one example of an upper waveguide of FIG. 1.

FIG. 4 illustrates one example of the upper waveguide 30 of FIG. 1.

Referring to FIGS. 2 to 4, the upper waveguide 30 may include an upper resonator 32. The upper resonator 32 may be disposed above the light emitting layer 22. When the light emitting layer 22 generates the pump light 21, the upper resonator 32 may allow the laser light 31 to be generated and resonate by using the pump light 21. The light emitting layer 22 and the upper resonator 32 are stacked, and thus the degree of integration of light sources may be increased. The intensity of the laser light 31 may be proportional to the intensity and/or energy of the pump light 21. When the pump light 21 has a visible light wavelength which has energy higher than that of an infrared light wavelength, the intensity of the laser light 31 may be increased. According to an embodiment of the inventive concept, the upper resonator 32 may include upper resonance holes 34, first upper mirror holes 36, and second upper mirror holes 38. The upper resonance holes 34, the first upper mirror holes 36, and the second upper mirror holes 38 may be arranged in the first direction X.

The upper resonance holes 34 may be disposed above the light emitting layer 22. The upper resonance holes 34 may absorb the pump light 21 to generate laser light 31. Each of the upper resonance holes 34 may have the diameter of about 100 nm to about 300 nm. The distance between the upper resonance holes 34 may be less than the diameter of each of the upper resonance holes 34. The diameters of the upper resonance holes 34 may vary according to the distance from the first upper mirror holes 36 and the second upper mirror holes 38. The diameters of the upper resonance holes 34 may be gradually reduced in a direction away from the first upper mirror holes 36 and the second upper mirror holes 38.

The first upper mirror holes 36 may be disposed on one side of the upper resonance holes 34. According to an embodiment of the inventive concept, the first upper mirror holes 36 may be total reflection mirror holes. The first upper mirror holes 36 may reflect the laser light 31 toward the upper resonance holes 34. The first upper mirror holes 36 may be greater than the upper resonance holes 34. For example, each of the first upper mirror holes 36 may have the diameter of about 300 nm to about 450 nm. The distance between the first upper mirror holes 36 may be less than the diameter of each of the first upper mirror holes 36.

The second upper mirror holes 38 may be disposed on the other side of the upper resonance holes 34. The second upper mirror holes 38 may be transflective mirror holes. The second upper mirror holes 38 may allow a portion of the laser light 31 to be transmitted or reflected. The second upper mirror holes 38 may have the same diameter as the first upper mirror holes 36. The distance between the second upper mirror holes 38 may be less than the diameter of each of the second upper mirror holes 38. The number of the second upper mirror holes 38 may be less than the number of the first upper mirror holes 36. For example, the number of the second upper mirror holes 38 may be 3 or less, the number of the first upper mirror holes 36 may be 4 or more.

An end of the upper waveguide 30 adjacent to the second upper mirror holes 38 may be tapered. The tapered end of the upper waveguide 30 may be coupled to the first lower waveguide 12. The laser light 31 may be transmitted to the first lower waveguide 12 via the tapered end of the upper waveguide 30.

Figure 5:
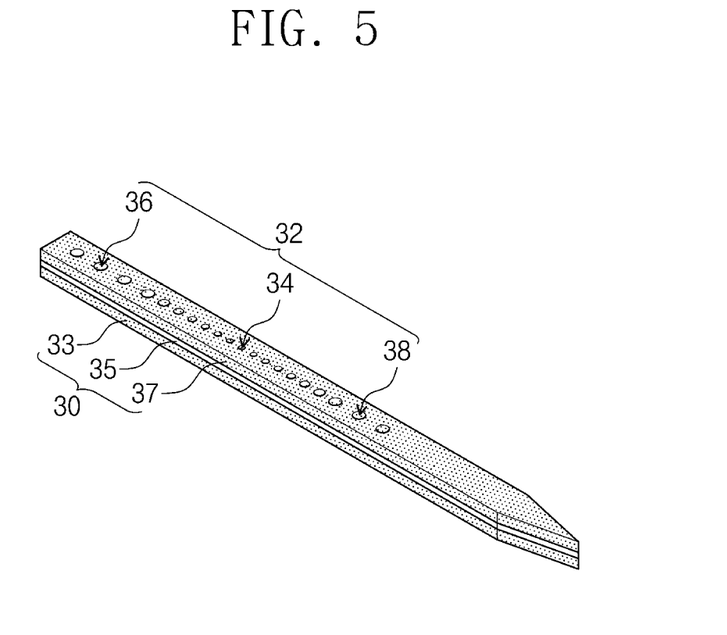
FIG. 5 is a perspective view illustrating one example of the upper waveguide of FIG. 1.

FIG. 5 illustrates one example of the upper waveguide 30 of FIG. 1.

Referring to FIG. 5, the upper waveguide 30 may include a lower layer 33, an active layer 35, and an upper layer 37. The lower layer 33, the active layer 35, and the upper layer 37 may be stacked. An upper resonator 32 may be constituted in the same manner as in FIGS. 2 and 4.

The lower layer 33 may include a group III-V semiconductor. For example, the lower layer 33 may include InGaAs.

The active layer 35 may be disposed between the lower layer 33 and the upper layer 37. The active layer 35 may include InGaAsP. Although not shown, the active layer 35 may include quantum dots. The quantum dots may control photons of the laser light 31. For example, the active layer 35 is operated as a single photon source and may realize quantum communication or quantum computing.

The upper layer 37 may be disposed on the active layer 35. The upper layer 37 and the lower layer 33 may be the same as each other. For example, the upper layer 37 may include InGaAs.

Figure 6:
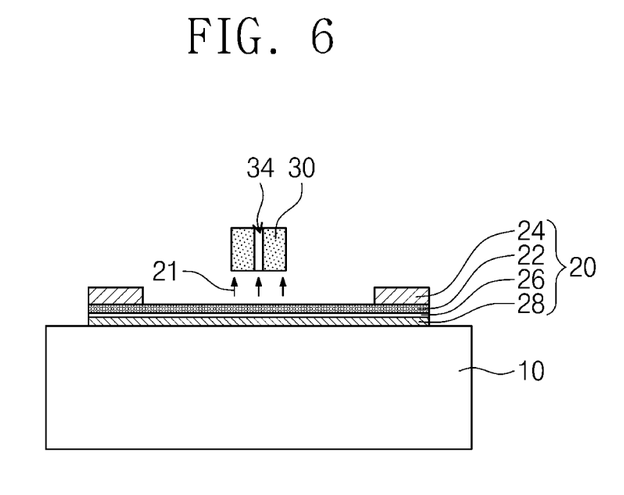
FIG. 6 is a cross-sectional view illustrating one example of a pump light source of FIG. 1.

FIG. 6 illustrates one example of the pump light source 20 of FIG. 1.

Referring to FIG. 6, the pump light source 20 may further include an interlayered insulating layer 26 and a lower electrode 28 between a light emitting layer 22 and a substrate 10. A substrate 10 and an upper waveguide 30 may be constituted in the same manner as in FIG. 3.

The light emitting layer 22 of the pump light source 20 may include metal chalcogenide. For example, the light emitting layer 22 may include $MoS_2$, $MoSe_2$, $WS_2$, $WSe_2$, $MoTe_2$, or $WTe_2$. The light emitting layer 22 may be thinner than each of the first lower waveguides 12.

The interlayered insulating layer 26 may be disposed between the light emitting layer 22 and the lower electrode 28. The interlayered insulating layer 26 may insulate the light emitting layer 22 from the lower electrode 28. For example, the interlayered insulating layer 26 may include a hexagonal boron nitride and $Al_2O_3$.

The lower electrode 28 may be disposed between the substrate 10 and the interlayered insulating layer 26. The lower electrode 28 may be a plate electrode. When exiting voltage is provided to the lower electrode 28, and source voltage is provided to the upper electrodes 24, the light emitting layer 22 may generate the pump light 21 by using the exiting voltage and the source voltage. The exiting voltage may be provided between the lower electrode 28 and the upper electrodes 24. The central wavelength of the pump light 21 may vary according to a type of the light emitting layer 22. When the light emitting layer 22 is $WSe_2$, the pump light 21 may have a wavelength of about 600 nm. When the light emitting layer 22 is $MoSe_2$, the pump light 21 may have a wavelength of about 700 nm.

Figure 7:
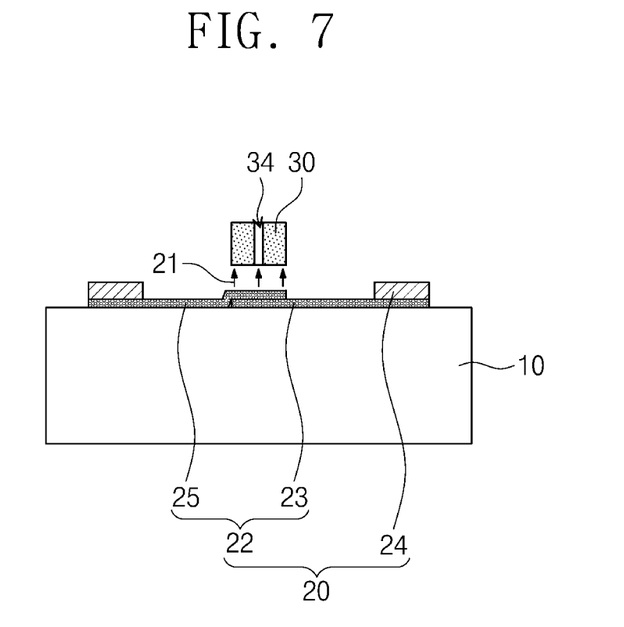
FIG. 7 is a cross-sectional view illustrating one example of the pump light source of FIG. 1.

FIG. 7 illustrates one example of the pump light source 20 of FIG. 1.

Referring to FIG. 7, a light emitting layer 22 of the pump light source 20 may include a first light emitting layer 23 and a second light emitting layer 25. A substrate 10 and an upper waveguide 30 may be constituted in the same manner as in FIG. 3.

The first light emitting layer 23 may be disposed between the substrate 10 and one of the upper electrodes 24. Also, the first light emitting layer 23 may be disposed between the substrate 10 and the upper waveguide 30. The first light emitting layer 23 may include WSe$_2$.

The second light emitting layer 25 may be disposed between the substrate 10 and the other one of the upper electrodes 24. Also, the second light emitting layer 25 may be disposed between the first light emitting layer 23 and the upper waveguide 30. The second light emitting layer 25 may include MoS$_2$. The first light emitting layer 23 and the second light emitting layer 25 may be stacked between the plurality of upper electrodes 24. The first light emitting layer 23 and the second light emitting layer 25, which are stacked on each other, may form a PN junction. When source voltage is provided to the upper electrodes 24, the pump light 21 may be generated at the PN junction of the first light emitting layer 23 and the second light emitting layer 25 stacked on each other.

Figure 8:
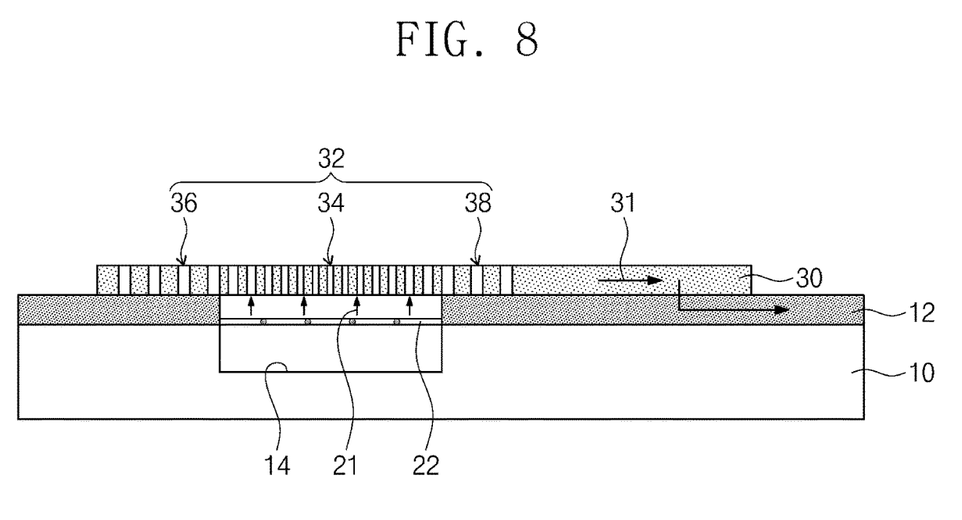
FIG. 8 is a cross-sectional view illustrating one example of a substrate of FIG. 1.

FIG. 8 illustrates one example of the substrate 10 of FIG. 1.

Referring to FIG. 8, the substrate 10 may include a recess 14. The recess 14 may be disposed below the light emitting layer 22 of the pump light source 20. The recess 14 may allow the pump light 21 to resonate and/or be stabilized. The recess 14 provides an air gap between the light emitting layer 22 and the substrate 10, and thus may induce the intensities of an electric field and/or a mode of the pump light 21 in a vertically symmetrical manner. First lower waveguides 12 and an upper waveguide 30 may be constituted in the same manner as in FIG. 2.

Figure 9:
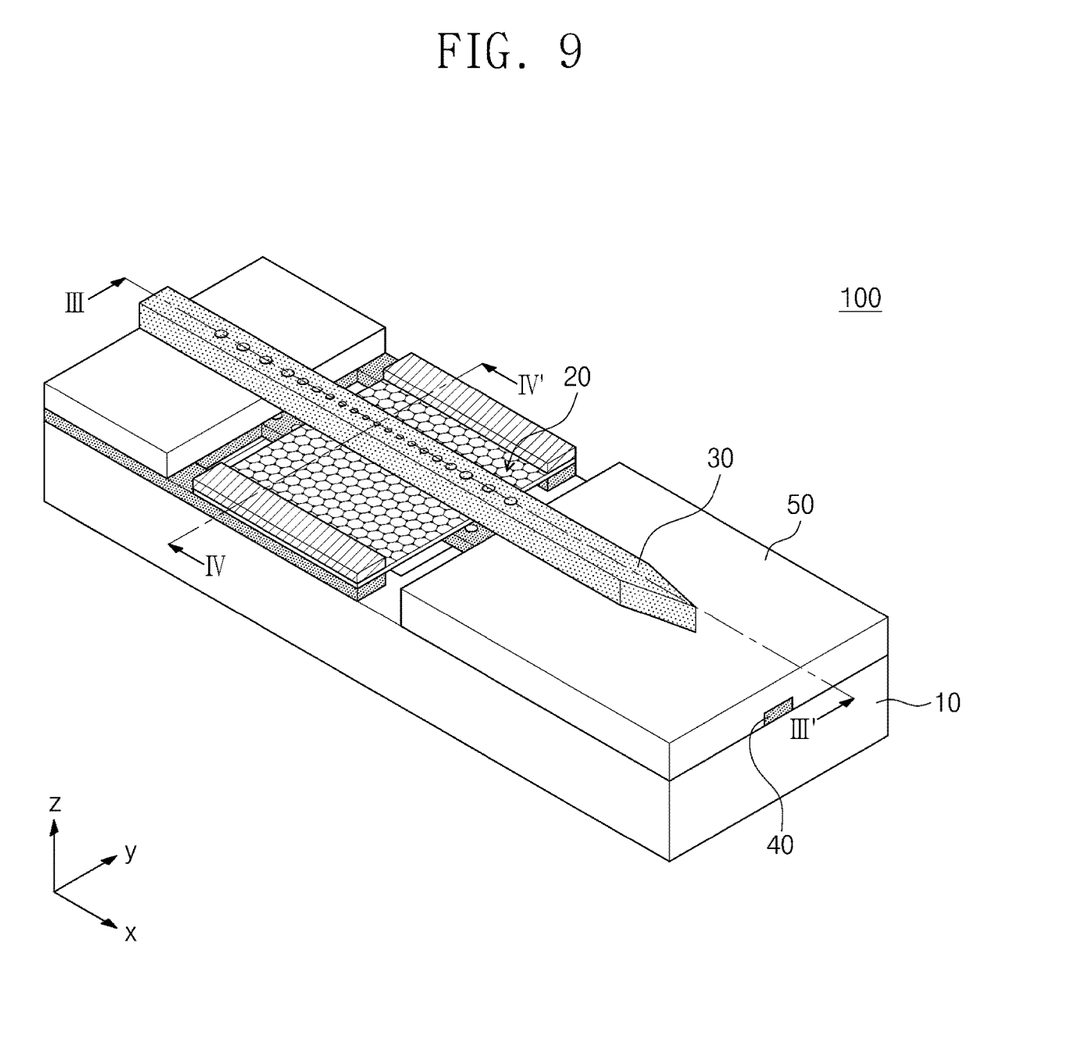
FIG. 9 is a perspective view illustrating one example of a laser device according to an embodiment of the inventive concept.

FIG. 9 illustrates one example of a laser device 100 according to an embodiment of the inventive concept.

Referring to FIG. 9, the laser device 100 according to an embodiment of the inventive concept may be one dimensional photonic crystal laser device. As one example, the laser device 100 according to an embodiment of the inventive concept may further include a second lower waveguide 40 and a dielectric layer 50. A substrate 10, a pump light source 20, and an upper waveguide 30 may be constituted in the same manner as in FIG. 1.

Figure 10:
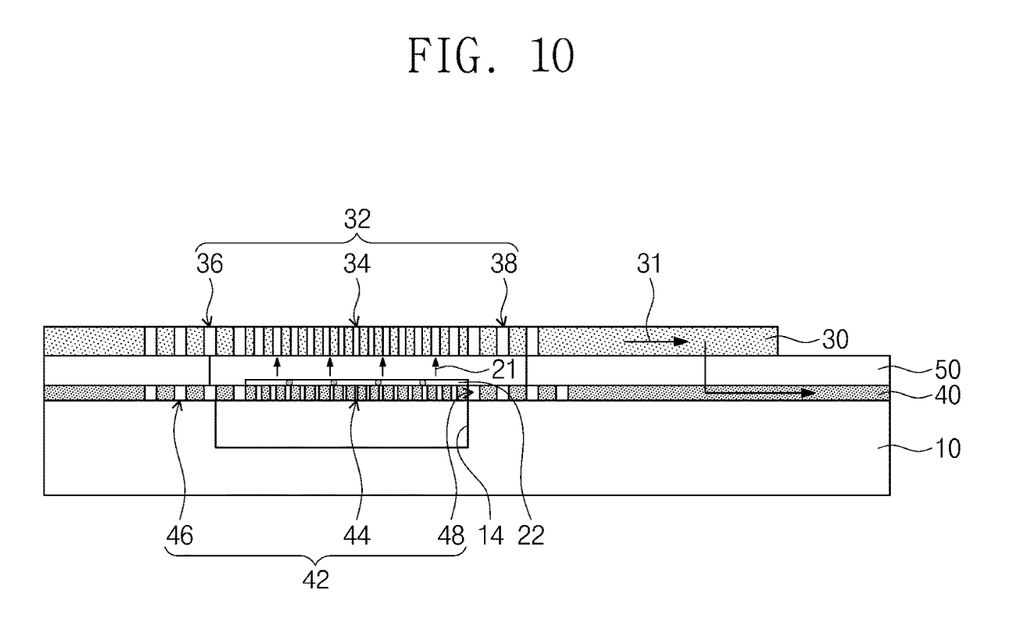
FIGS. 10 and 11 are cross-sectional views, taken along lines and IV-IV' of FIG. 10, respectively.
Figure 11:
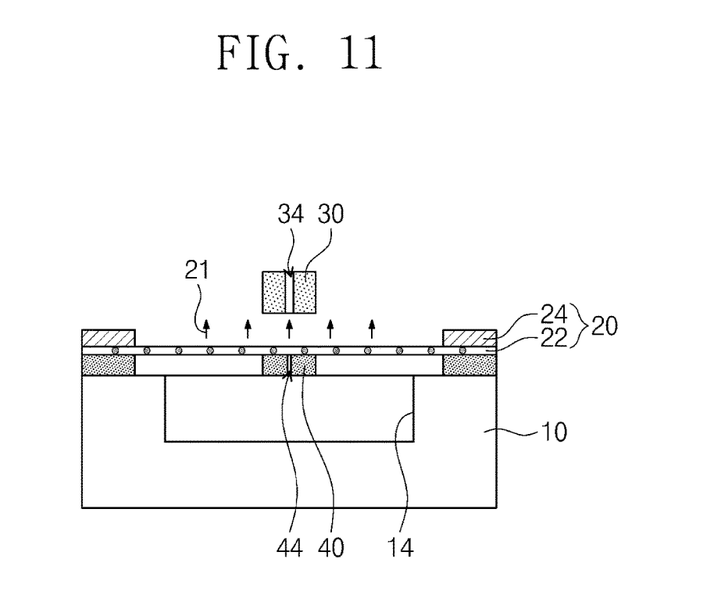

FIGS. 10 and 11 illustrate views taken along lines and IV-IV' of FIG. 10, respectively.

Referring to FIGS. 10 and 11, the second lower waveguide 40 may be disposed between the substrate 10 and the pump light source 20. The second lower waveguide 40 may extend in a first direction X. The second lower waveguide 40 may be disposed between the substrate 10 and the dielectric layer 50. For example, the second lower waveguide 40 may include crystalline silicon. According to an embodiment of the inventive concept, the second lower waveguide 40 may include a lower resonator 42.

The lower resonator 42 may be disposed between the substrate 10 and the pump light source 20. The lower resonator 42 may allow the pump light 21 to resonate. The lower resonator 42 may be a photonic crystal resonator. The lower resonator 42 may discharge the pump light 21 in a third direction Z. Also, the lower resonator 42 may increase the intensity of the central wavelength of the pump light 21. When the pump light 21 has a wavelength of about 600 nm to about 700 nm, the lower resonator 42 may increase the intensity of the central wavelength of about 650 nm. According to an embodiment of the inventive concept, the lower resonator 42 may include lower resonance holes 44, first lower mirror holes 46, and second lower mirror holes 48.

Figure 12:
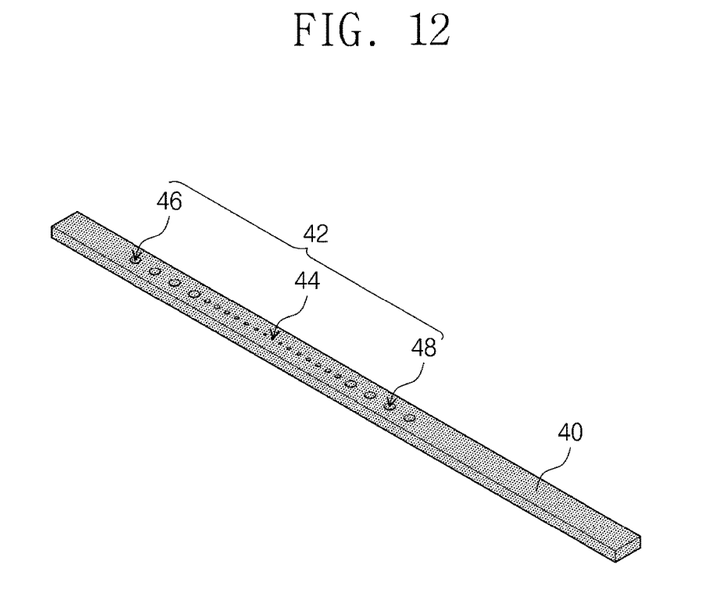
FIG. 12 is a perspective view illustrating one example of a second lower waveguide of FIG. 11.

FIG. 12 illustrates one example of the second lower waveguide 40 of FIG. 11.

Referring to FIGS. 10 to 12, the lower resonance holes 44 may be disposed below the upper resonance holes 34. The lower resonance holes 44 may allow the central wavelength of the pump light 21 to resonate. The pump light 21 having a resonating central wavelength may be transmitted through the light emitting layer 22 and provided to the upper waveguide 30. The lower resonance holes 44 may have sizes less than those of the upper resonance holes 34. For example, each of the lower resonance holes 44 may have the diameter of about 200 nm or less. The diameters of the lower resonance holes 44 may be gradually reduced in a direction away from the first lower mirror holes 46 and the second lower mirror holes 48. The distance between the lower resonance holes 44 may be less than the diameter of each of the lower resonance holes 44.

The first lower mirror holes 46 may be disposed on one side of the lower resonance holes 44. The first lower mirror holes 46 may reflect the pump light 21 of the central wavelength toward the lower resonance holes 44. The first lower mirror holes 46 may be disposed below the first upper mirror holes 36. The first lower mirror holes 46 may have the same size as the first upper mirror holes 36. For example, each of the first lower mirror holes 46 may have the diameter of about 300 nm to about 450 nm. The distance between the first lower mirror holes 46 may be less than the diameter of each of the first lower mirror holes 36.

The second lower mirror holes 48 may be disposed on the other side of the lower resonance holes 44. The second lower mirror holes 48 may be disposed below the second upper mirror holes 38. The second lower mirror holes 48 may reflect the pump light 21 of the central wavelength toward the lower resonance holes 44. The second lower mirror holes 48 may have the same size as the first lower mirror holes 46. For example, each of the second lower mirror holes 48 may have the diameter of about 400 nm to about 450 nm. The distance between the second lower mirror holes 48 may be less than the diameter of each of the second lower mirror holes 48.

Referring to FIG. 10 again, the dielectric layer 50 may be disposed between the second lower waveguide 40 and the upper waveguide 30. The dielectric layer 50 may separate the upper waveguide 30 from the second lower waveguide 40. The dielectric layer 50 may have a refractive index less than a refractive index of the second lower waveguide 40 and greater than a refractive index of the upper waveguide 30. For example, the dielectric layer 50 may include an organic polymer, but the embodiment of the inventive concept is not limited thereto.

Figure 13:
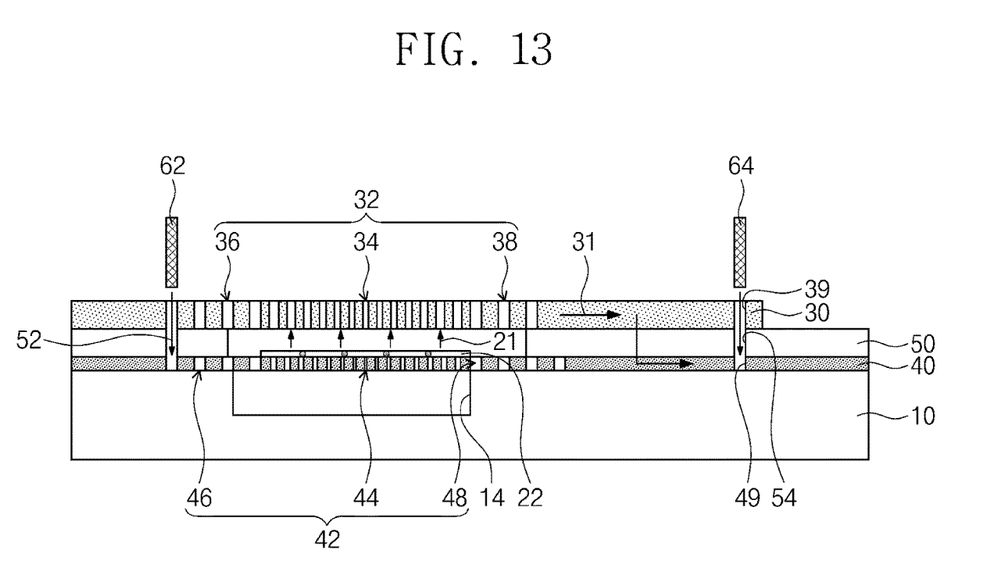
FIG. 13 is a cross-sectional view illustrating a first alignment key and a second alignment key for aligning an upper waveguide with the second lower waveguide of FIG. 9.

FIG. 13 illustrates a first alignment key 62 and a second alignment key 64 for aligning an upper waveguide 30 with the second lower waveguide 40 of FIG. 9.

Referring to FIG. 13, the laser device 100 according to an embodiment of the inventive concept may further include the first alignment key 62 and the second alignment key 64. A substrate 10 and a pump light source 20 may be constituted in the same manner as in FIGS. 9 and 10. The first alignment key 62 and the second alignment key 64 pass through the dielectric layer 50 and may align the upper waveguide 30 with the second lower waveguide 40.

The dielectric layer 50 may include a first through-hole 52 and a second through-hole 54. The first through-hole 52 may be disposed between the upper resonator 32 and the lower resonator 42. According to an embodiment of the inventive concept, the first through-hole 52 may be disposed between the first lower mirror hole 46 and the first upper mirror hole 36. The second through-hole 54 may be disposed outside the upper resonator 32 and the lower resonator 42.

The first alignment key 62 may be provided within the first upper mirror hole 36, the first through-hole 52, and the first lower mirror hole 46. The first upper mirror hole 36 may be aligned with the first lower mirror hole 46 by the first alignment key 62. Thus, the upper waveguide 30 may be aligned with the second lower waveguide 40.

The upper waveguide 30 may include an upper alignment hole 39. The upper alignment hole 39 may be disposed above the second through-hole 54. The upper alignment hole 39 may be spaced a coupling length Lc from the second upper mirror holes 38 of the upper resonator 32. The coupling length Lc may be a distance in which the laser light 31 can be transmitted entirely from the upper waveguide 30 to the second lower waveguide 40. For example, the coupling length Lc may be about 1 µm to about 1 mm.

The second lower waveguide 40 may include a lower alignment hole 49. The lower alignment hole 49 may be disposed below the upper alignment hole 39 and the second through-hole 54.

The second alignment key 64 are provided within the upper alignment hole 39, the second through-hole 54, and the lower alignment hole 49, and may align the upper waveguide 30 with the second lower waveguide 40. Also, the second alignment key 64 may connect the upper waveguide 30 to the second lower waveguide 40. The second alignment key 64 may transmit the laser light 31 from the upper waveguide 30 to the second lower waveguide 40.

Figure 14:
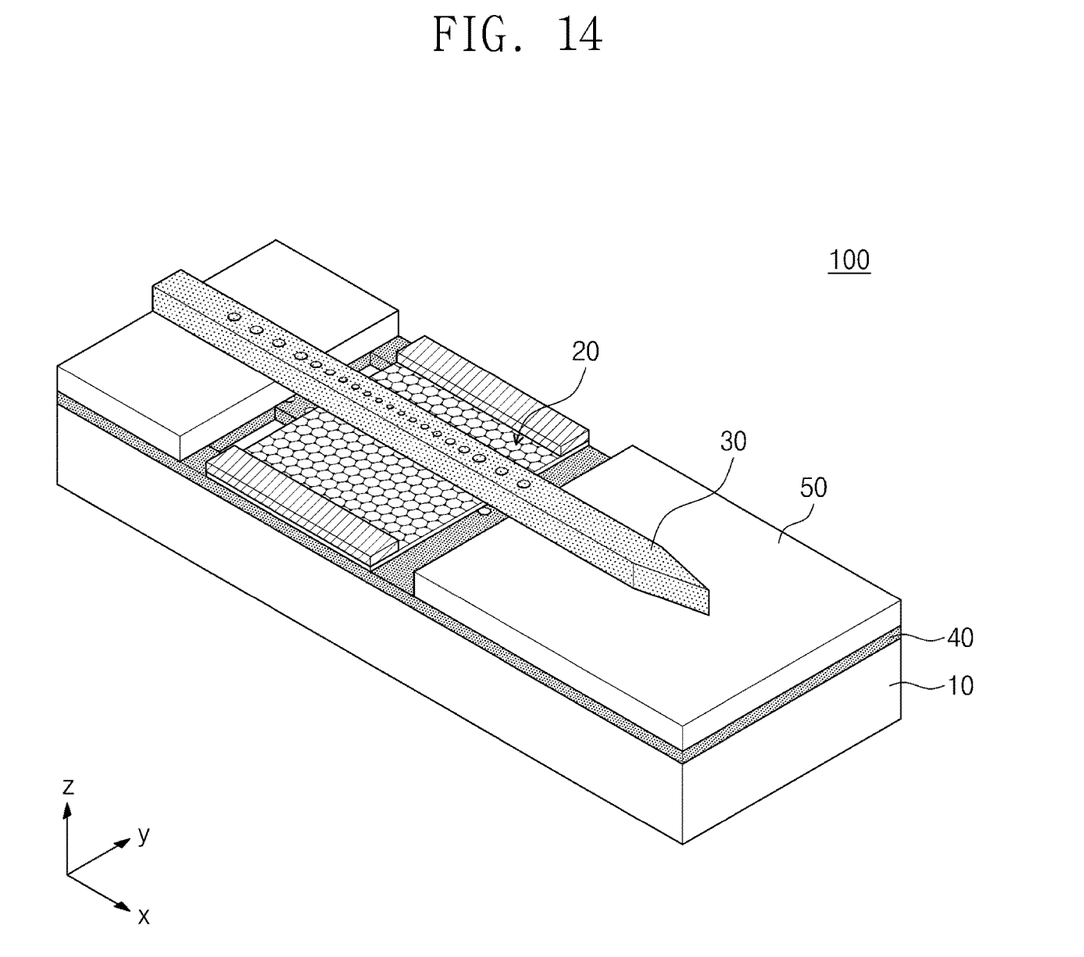
FIG. 14 is a perspective view illustrating one example of a laser device according to an embodiment of the inventive concept.

FIG. 14 illustrates one example of a laser device 100 according to an embodiment of the inventive concept.

Referring to FIG. 14, a second lower waveguide 40 of the laser device 100 according to an embodiment of the inventive concept may be a plate waveguide. A lower resonator 42 of the second lower waveguide 40 may be a line waveguide. A substrate 10, a pump light source 20, an upper waveguide 30, and a dielectric layer 50 may be constituted in the same manner as in FIG. 9.

As described above, the laser device according to the embodiment of the inventive concept may increase the degree of integration of the plurality of light sources by using the upper waveguide which includes the upper resonator above the light emitting layer of the pump light source.

Although the embodiments of the inventive concept are described with reference to the accompanying drawings, those with ordinary skill in the technical field to which the present disclosure pertains will understand that the present disclosure can be carried out in other specific forms without changing the technical idea or essential features. Therefore, the above-described embodiments are to be considered in all aspects as illustrative and not restrictive.

What is claimed is:

1. A laser device comprising:
   a substrate;
   a pump light source which is disposed on the substrate and has a light emitting layer configured to generate pump light;
   an upper waveguide having an upper resonator configured to allow laser light to be generated and resonate using the pump light, and
   a lower waveguide comprising a lower resonator disposed between the light emitting layer and the substrate and extending in a first direction,
   wherein the upper waveguide and the lower waveguide are configured to guide the laser light in the first direction, and the light emitting layer is disposed between the upper waveguide and the lower waveguide,
   wherein the lower resonator comprises:
   a lower resonance hole;
   a first lower mirror hole disposed on one side of the lower resonance hole; and
   a second lower mirror hole disposed on the other side of the lower resonance hole,
   wherein the upper resonator comprises:
   an upper resonance hole which is disposed above the lower resonance hole and larger than the lower resonance hole;
   a first upper mirror hole disposed on one side of the upper resonance hole; and
   a second upper mirror hole disposed on the other side of the upper resonance hole.

2. The laser device of claim 1, wherein the light emitting layer comprises graphene or metal chalcogenide.

3. The laser device of claim 1, wherein the pump light source further comprises upper electrodes which are disposed on both side walls of the light emitting layer outside the upper waveguide.

4. The laser device of claim 1, wherein the pump light source further comprises a lower electrode between the light emitting layer and the substrate.

5. The laser device of claim 1, further comprising a first alignment key which is provided within the first upper mirror hole and the first lower mirror hole.

6. The laser device of claim 1, wherein the upper waveguide further comprises an upper alignment hole which is spaced apart from the upper resonator, and the lower waveguide further comprises a lower alignment hole which is spaced apart from the lower resonator, wherein the laser device further comprises an alignment key which is provided within the upper alignment hole and the lower alignment hole.

7. A laser device comprising:
   a lower waveguide comprising a lower resonator on a substrate;
   a pump light source which is disposed on the lower resonator and has a light emitting layer configured to generate pump light; and
   an upper waveguide which is disposed above the light emitting layer and the lower waveguide and has an upper resonator configured to allow laser light to be generated and resonate using the pump light,
   wherein the lower resonator comprises:
   a lower resonance hole;
   a first lower mirror hole which is disposed on one side of the lower resonance hole and larger than the lower resonance hole; and
   a second lower mirror hole which is disposed on the other side of the lower resonance hole and has the same size as the first lower mirror hole, and
   wherein the upper resonator comprises:
   an upper resonance hole which is disposed above the lower resonance hole and larger than the lower resonance hole;
   a first upper mirror hole which is disposed on one side of the upper resonance hole and larger than the upper resonance hole; and
   a second upper mirror hole which is disposed on the other side of the upper resonance hole and has the same size as the first upper mirror hole.

8. The laser device of claim 7, further comprising a first alignment key which is provided within the first lower mirror hole and the first upper mirror hole.

9. The laser device of claim 7, wherein the upper resonance hole is larger than the lower resonance hole, and the first and second lower mirror holes have the same size as the first and second upper mirror holes.

10. The laser device of claim 7, further comprising a dielectric layer which is disposed between the lower waveguide and the upper waveguide outside the light emitting layer.

11. The laser device of claim 10, wherein the upper waveguide further comprises an upper alignment hole which is spaced a coupling length from the upper resonator, and the lower waveguide further comprises a lower alignment hole which is disposed below the upper alignment hole.

12. The laser device of claim 11, further comprising an alignment key which passes through the dielectric layer and is provided within the upper alignment hole and the lower alignment hole.

13. The laser device of claim 11, wherein the dielectric layer has a refractive index greater than a refractive index of the upper waveguide and less than a refractive index of the lower waveguide.

14. The laser device of claim 7, wherein the substrate comprises a recess which is disposed below the lower resonator.

\* \* \* \* \*